Figure 1:
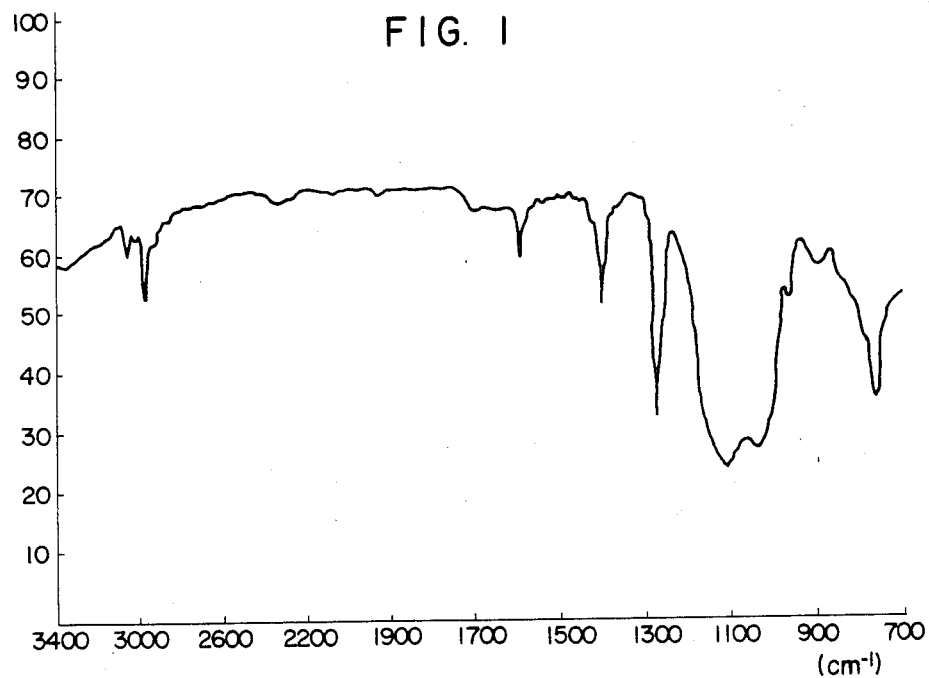

United States Patent [19]

Nozue et al.

[11] Patent Number: 4,626,556
[45] Date of Patent: Dec. 2, 1986

[54] SOLVENT-SOLUBLE ORGANOPOLYSILSESQUIOXANE, PROCESS FOR PRODUCING THE SAME, AND SEMI-CONDUCTOR USING THE SAME

[75] Inventors: Ikuo Nozue; Osahiko Tomomitsu; Yoshiji Yumoto, all of Yokohama; Yoshio Matsumura, Yokkaichi, both of Japan

[73] Assignee: Japan Synthetic Rubber Co., Ltd., Tokyo, Japan

[21] Appl. No.: 779,617

[22] Filed: Sep. 25, 1985

Related U.S. Application Data

[63] Continuation of Ser. No. 422,196, Sep. 23, 1982, abandoned.

[30] Foreign Application Priority Data

Oct. 3, 1981 [JP] Japan ............................ 56-157885
Oct. 22, 1981 [JP] Japan ............................ 56-169178
Nov. 30, 1981 [JP] Japan ............................ 56-190667

[51] Int. Cl.⁴ .................................................. C08F 2/46
[52] U.S. Cl. ........................................ 522/99; 528/10; 528/31; 528/32; 528/43; 357/72; 357/52; 357/8; 357/84; 427/93
[58] Field of Search .............. 528/10, 32, 43, 31; 204/159.13; 522/99

[56] References Cited

U.S. PATENT DOCUMENTS

| | | | |
|---|---|---|---|
| 3,372,133 | 3/1968 | Krantz | 528/43 X |
| 4,273,420 | 6/1981 | Watanabe et al. | 528/43 X |
| 4,300,153 | 11/1981 | Hayakawa et al. | 357/72 X |
| 4,399,266 | 8/1983 | Matsumura et al. | 528/43 X |
| 4,480,009 | 10/1984 | Berger | 357/72 X |

Primary Examiner—Melvyn I. Marquis
Attorney, Agent, or Firm—Oblon, Fisher, Spivak, McClelland & Maier

[57] ABSTRACT

A novel raddery organopolysilsesquioxane having lower alkyl groups and alkenyl groups as the side chains and, if necessary, having aryl groups and/or hydrogen atoms bonded as the side chains can be produced by adding water to a solution of a lower-alkyl-trihalogenosilane, an alkenyltrihalogenosilane, and, if necessary, an aryltrihalogenosilane and/or a trihalogenosilane in an organic solvent, and heating the resulting mixture. The aforesaid organopolysilsesquioxane can be used for forming a patterned surface-protecting layer or insulating layer for a semiconductor device, in the form of a mixture with a compound which generates crosslinking-reaction-active species upon irradiation with light or an ionizing radiation.

15 Claims, 15 Drawing Figures

SOLVENT-SOLUBLE ORGANOPOLYSILSESQUIOXANE, PROCESS FOR PRODUCING THE SAME, AND SEMI-CONDUCTOR USING THE SAME

This application is a continuation, of application Ser. No. 422,196, filed Sept. 23, 1982 and now abandoned.

This invention relates to a solvent-soluble polysilsesquioxane which has lower alkyl groups and alkenyl groups as side chains and whch possesses excellent heat resistance; a process for producing the same; a silicone resin composition comprising a polysilsesquioxane having lower alkyl groups and alkenyl groups as side chains and a compound which generates a plurality of cross-linking-reaction-active species by irradiation with light or ionizing radiation; a semiconductor device produced by using the silicone resin composition; and a process for producing the semiconductor device.

There have heretofore been known polysilsesquioxanes having aryl groups such as phenyl or tolyl and solvent-soluble polysilsesquioxanes having alkyl groups such as methyl, isobutyl, isoamyl or the like [J. Amer. Chem. Soc., Vol. 82, p. 6194 (1960); J. Polymer Sci., Vol. C-1, p. 83 (1963); Vysokomol. Soyed., Vol. A12, p. 663 (1970); Izv. Akad. Nauk SSSR Ser Khim., p. 625 (1969); Japanese Patent Application Kokai (Laid-Open) Nos. 139,900/75 and 88,099/78, etc.). However, these are inferior in heat resistance and adhesion to a substrate.

G. H. Wagner et al. have synthesized a vinylpolysilsesquioxane having a number average molecular weight of about 3,800 by hydrolyzing vinyltrichlorosilane in an ether [Ind. Eng. Chem., Vol. 45, p. 367 (1953)]. This compound is also inferior in heat resistance and is low in storage stability. Recently, Yamazaki et al. have obtained a polysilsesquioxane having a molecular weight of about 10,000 and having phenyl groups and vinyl groups or (meth)acryloxyalkyl groups as side chains by a two-step reaction comprising cohydrolyzing a vinyltrialkoxysilane or a (meth)acryloxyalkyltrialkoxysilane with a phenyltrialkoxysilane to obtain an oligomer with a molecular weight of about 1,000, and then subjecting the oligomer to condensation reaction in the presence of an alkali catalyst [Preliminary Lectures in the 29th Annual Meeting of Polymer Society of Japan, Vol. 29, No. 1, p. 73 (1980)]. However, the alkali catalyst remains in the polysilsesquioxane thus obtained and acts as a catalyst for depolymerization of the polysilsesquioxane at high temperatures, and hence, sufficient heat resistance cannot be expected.

This invention provides an organopolysilsesquioxane having a high heat resistance and having alkenyl groups rich in reactivity as side chains.

This invention further provides a solvent-soluble organopolysilsesquioxane represented by the formula (I):

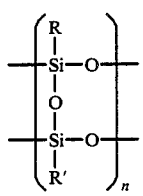

wherein R and R', which may be the same or different, represent hydrogen atoms or organic groups, and n is a degree of polymerization, characterized in that the organopolysilsesquioxane has bonded thereto lower alkyl groups, alkenyl groups and, if necessary, aryl groups and/or hydrogen atoms as said R and R' which are side chains (the above compound is hereinafter referred to merely as the organopolysilsesquioxane). In addition, this invention provides a process (A) for producing the organopolysilsesquioxane, characterized by adding water to a solution of a lower-alkyltrihalogenosilane, an alkenyltrihalogenosilane and, if necesssary, an aryltrihalogenosilane and/or a trihalogenosilane in an organic solvent, and then heating the resulting mixture, as well as a process (B) for producing the organopolysilsesquioxane, characterized by adding water in the presence of an organic amine to a solution of a lower-alkyltrialkoxysilane, an alkenyltrialkoxysilane and, if necessary, an aryltrialkoxysilane and/or a trialkoxysilane in an organic solvent, and heating the resulting mixture.

Furthermore, this invention provides a composition comprising the organopolysilsesquioxane and a compound which generates crosslinking-reaction-active species upon irradiation with light or an ionizing radiation (the above composition is hereinafter referred to as the silicone resin composition).

In addition, this invention provides a semiconductor device having a patterned surface-protecting or insulating layer which consists of the organopolysilsesquioxane crosslinked by irradiation with light or an ionizing radiation, and a process for producing a semiconductor device comprising the first step of forming a layer of the organopolysilsesquioxane or the silicone resin composition on the surface of a semiconductor device material on which a patterned surface-protecting or insulating layer is to be formed, and the second step of irradiating a part of the aforesaid layer with light or an ionizing radiation to crosslink the irradiated portions and then removing the unirradiated portions.

Figure 6:
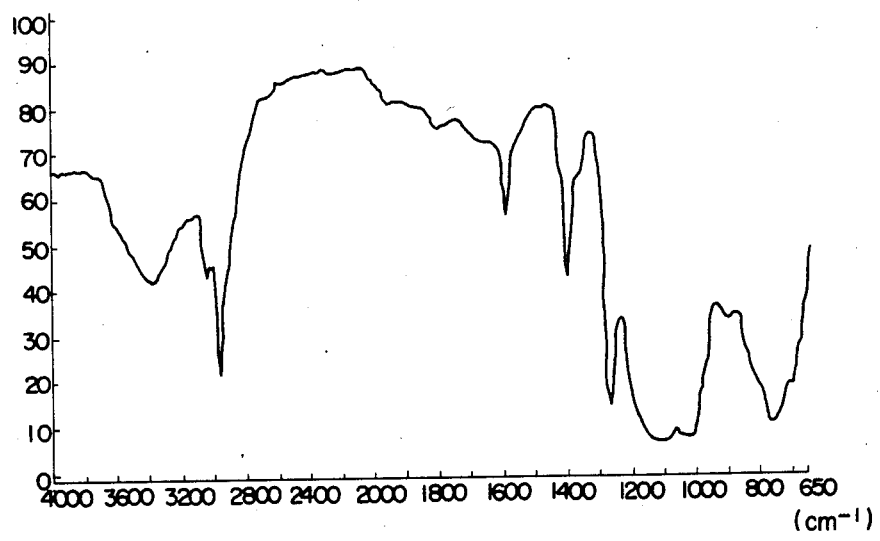
Figure 7:
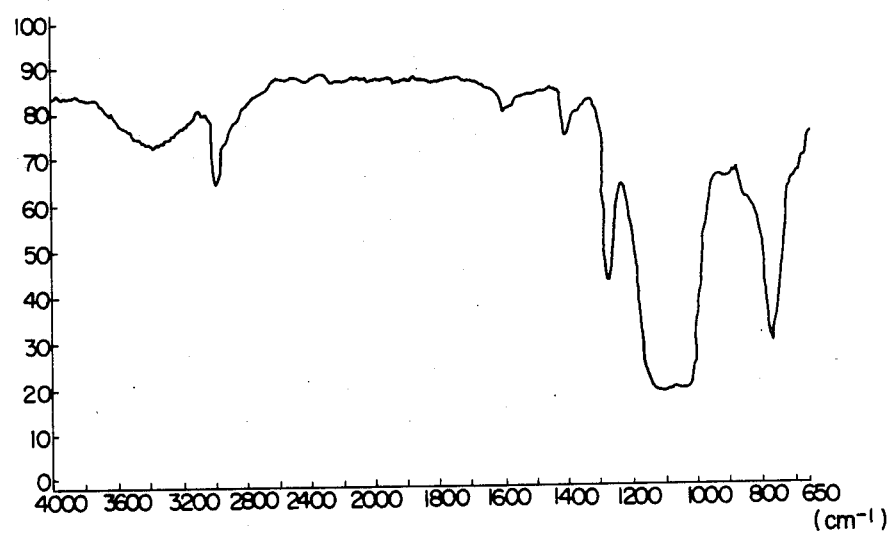
Figure 8:
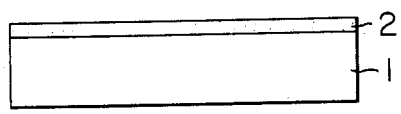
Figure 9:
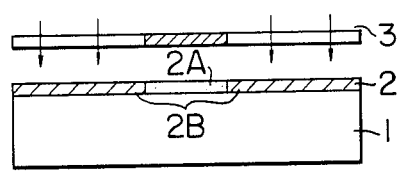
Figure 10:
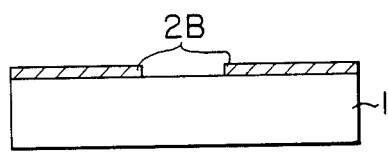

This invention is explained below in detail referring to the accompanying drawings, in which FIGS. 1 to 7 show infrared absorption spectra of organopolysilsesquioxanes obtained in Examples 1 to 7, respectively, which appear hereinafter, FIGS. 8 to 10 are explanatory cross-sectional views showing the process for forming a pattern using the organopolysilsesquioxane of this invention in order of step, and FIGS. 11 to 15 are explanatory cross-sectional views showing a process for producing a semiconductor device in order of step. In FIGS. 8 to 14, 1 . . . a substrate, 2 . . . a layer of the silicone resin composition, 3 . . . a pattern mask, 11 . . . a semiconductor substrate, 12 . . . a protective film, 13, 13A and 13B . . . wiring layers, 14, 14A and 14B . . . insulating layers, 15 . . . a contact hole.

In the organopolysilsesquioxane of this invention, as the lower alkyl group to be bonded as side chains, there may be used those having 1 to 5 carbon atoms, for example, a methyl group, an ethyl group, a propyl group, a butyl group and the like, which may be used alone or in combination of two or more, and as the alkenyl group to be bonded as side chains, there may be employed those having 2 to 5 carbon atoms, for example, a vinyl group, a propenyl group, a butenyl group, a pentenyl group, an allyl group and the like, which may be used alone or in combination of two or more. The aryl group to be bonded as side chains, if necessary, may have preferably 6 to 10 carbon atoms, and there may be used a phenyl group, a dimethylphenyl group, an ethylphenyl group, a trimethylphenyl group, a methylethylphenyl group, a propylphenyl group, a tetramethylphenyl group, a methylpropylphenyl group, a diethylphenyl group, a butylphenyl group, a tolyl group and the like, which may be used alone or in combination of two or more.

A methyl group and a vinyl group are the preferred lower alkyl and alkenyl groups, respectively. When the organopolysilsesquioxane contains these groups, it has excellent heat resistance. As the aryl group to be bonded as side chains, if necessary, a phenyl group is preferred from the viewpoint of ease of synthesis of the organopolysilsesquioxane.

In the organopolysilsesquioxane of this invention, the numbers of lower alkyl groups, alkenyl groups, aryl groups and hydrogen atoms bonded as side chains per 100 side chains in total are preferably 50–99, 1–50, 0–49 and 0–49, respectively, more preferably 70–99, 1–30, 0–29 and 0–29, respectively. Owing to the presence of 50 or more lower alkyl groups per 100 side chains in total the resulting organopolysilsesquioxane comes to have better heat resistance, and owing to the presence of 1 or more alkenyl groups per 100 side chains in total, the resulting organopolysilsesquioxane comes to have particularly excellent reactivity.

The production process (A) of this invention is explained below.

As the lower-alkyltrihalogenosilane in the production process (A) of this invention, there may be used, for example, methyltrichlorosilane, ethyltrichlorosilane, propyltrichlorosilane, butyltrichlorosilane, methyltribromosilane and the like; as the alkenyltrihalogenosilane, there may be used vinyltrichlorosilane, propenyltrichlorosilane, butenyltrichlorosilane, pentenyltrichlorosilane, allyltrichlorosilane, vinyltribromosilane and the like; as the optional aryltrihalogenosilane, there may be used phenyltrichlorosilane, dimethylphenyltrichlorosilane, ethylphenyltrichlorosilane, trimethylphenyltrichlorosilane, methylethylphenyltrichlorosilane, propylphenyltrichlorosilane, tetramethylphenyltrichlorosilane, methylpropylphenyltrichlorosilane, diethylphenyltrichlorosilane, butylphenyltrichlorosilane, tolyltrichlorosilane, phenyltribromosilane and the like; and as the optional trihalogenosilane, there may be used trichlorosilane, tribromosilane and the like.

The amounts of the lower-alkyltrihalogenosilane, the alkenyltrihalogenosilane, the aryltrihalogenosilane and the trihalogenosilane used may appropriately be determined depending upon the proportions of the lower alkyl and alkenyl groups to be bonded as the side chains of the desired organopolysilsesquioxane and upon the proportions of the aryl group and the hydrogen atom to be, if necessary, bonded as side chains, but the amount of the lower-alkyltrihalogenosilane used is preferably 50 to 99 mole %, more preferably 70 to 99 mole %, the amount of the alkenyltrihalogenosilane used is preferably 1 to 50 mole %, more preferably 1 to 30 mole %, the amount of the aryltrihalogenosilane used is preferably 0 to 49 mole %, more preferably 0 to 29 mole %, and the amount of the trihalogenosilane used is preferably 0 to 49 mole %, more preferably 0 to 29 mole %, and the total sum of them is 100 mole %. The employment of an aryltrihalogenosilane sometimes further facilitates the synthesis of an organopolysilsesquioxane. The employment of a trihalogenosilane results in an improvement in physical or chemical properties of the organopolysilsesquioxane.

As the organic solvent, there may be used, for example, ketones such as methyl ethyl ketone, diethyl ketone, methyl isobutyl ketone and the like; ethers such as ethylene glycol dimethyl ether, di-n-propyl ether, dioxane, diethylene glycol dimethyl ether, tetrahydrofuran and the like; aliphatic hydrocarbons such as heptane, octane and the like; aromatic hydrocarbons such as toluene, xylene and the like; halogenated hydrocarbons such as 1,2-dichloroethane, 1,1,2-trichloroethane, 1,3-dichloropropane, chlorobenzene and the like; alcohols such as n-propyl alcohol, n-butyl alcohol, isobutyl alcohol, hexyl alcohol, 4-methyl-2-pentanol and the like; and esters such as ethyl propionate, ethyl isobutyrate, isobutyl acetate, n-butyl acetate, isoamyl acetate and the like. An organic solvent containing a ketone and/or an ether in an amount of 40 mole % or more, particularly 60 mole % or more is preferred from the viewpoint of ease of the synthesis of the desired organopolysilsesquioxane.

The amount of the organic solvent used is preferably 4 to 20 parts by volume per part by volume of the sum of the lower-alkyltrihalogenosilane, the alkenyltrihalogenosilane, the aryltrihalogenosilane and the trihalogenosilane used (these four silanes are hereinafter referred to as the halogenosilanes).

The hydrolysis of the halogenosilanes is effected by adding water to a solution of the halogenosilanes in an organic solvent. In this case, in order to facilitate the control of the reaction, it is preferable to use a method by which the solution is cooled to, for example, 10° to 50° C. and water is gradually added thereto with stirring. The amount of water used is preferably about 3 to 30 moles per mole of the sum of the halogenosilanes.

After the addition of water, the reaction mixture is heated, for example, on an oil bath to effect condensation. The heating temperature is 130° C. or less, and it is preferable to heat at 70° to 110° C. for about 1 to 6 hours.

During the condensation, the reaction mixture may be stirred or merely left refluxing.

When an amine is present when adding water to a solution of the halogenosilanes in an organic solvent and heating the resulting mixture, the reaction proceeds smoothly even if the concentration of the halogenosilanes is high, so that an organopolysilsesquioxane having a high molecular weight can be obtained.

As the amine, there may be used various primary to tertiary amines, for example, triethylamine, tri-n-propylamine, triisopropylamine, diethylamine, dipropylamine, ethylamine, pyridine, ethylenediamine, aniline and the like.

The amount of the amine used is usually 3 moles or less, preferably about 0.3 to 2 moles, per mole of the sum of the halogenosilanes.

When an amine is used, a white precipitate of the hydrochloride of the amine is gradually formed when water is added dropwise to a solution of the halogenosilanes. As more water is added drowise, the white precipitate gradually dissolves. After completion of the addition of water, the reaction mixture is heated to effect condensation, in a similar manner to the case where no amine is added.

After completion of the heating, whether an amine is used or not, the organic solvent layer is separated and then washed with water. When, in this case, there is used water containing a small amount of a salt, for example, a 0.1 to 0.5% by weight aqueous ammonium nitrate solution, the washing operation is easy. After the washing is repeated until the washings become neutral, the organic solvent layer is, if necessary, dried by means of a drying agent such as anhydrous calcium sulfate, molecular sieves or the like and is concentrated to dryness, or alternatively, the organic solvent layer is concentrated to a suitable concentration and poured into a solvent in which the organopolysilsesquioxane obtained can not be dissolved, for example, acetonitrile, whereby the desired organopolysilsesquioxane is obtained.

The production process (B) of this invention is further explained below.

As the lower-alkyltrialkoxysilane in the production process (B) of this invention, there may be used, for example, methyltrimethoxysilane, methyltriethoxysilane, ethyltrimethoxysilane, ethyltriethoxysilane, propyltrimethoxysiaane, propyltriethoxysilane, methyltripropoxysilane, ethyltripropoxysilane, butyltrimethoxysilane and the like. As the alkenyltrialkoxysilane, there may be used vinyltrimethoxysilane, vinyltriethoxysilane, vinyltripropoxysilane, propenyltrimethoxysilane, propenyltripropoxysilane, butenyltrimethoxysilane, pentenyltrimethoxysilane, allyltrimethoxysilane, allyltriethoxysilane and the like. As the optional aryltrialkoxysilane, there may be used phenyltrimethoxysilane, phenyltriethoxysilane, phenyltripropoxysilane, dimethylphenyltrimethoxysilane, ethylphenyltrimethoxysilane, trimethylphenyltrimethoxysilane, methylphenyltrimethoxysilane, propylphenyltrimethoxysilane, tetramethylphenyltrimethoxylsilane, methylpropylphenyltrimethoxysilane, diethylphenyltrimethoxysilane, butylphenyltrimethoxysilane, tolyltrimethoxysilane, tolyltriethoxysilane and the like, and as the optional trialkoxysilane, there may be used trimethoxysilane, triethoxysilane, tripropoxysilane and the like. The amounts of the lower-alkyltrialkoxysilane, the alkenyltrialkoxysilane, the aryltrialkoxysilane and the trialkoxysilane used may appropriately be determined depending upon the proportions of the lower alkyl group and the alkenyl group to be bonded as the side chains of the desired organopolysilsesquioxane and upon the proportions of the aryl group and the hydrogen atom bonded as side chains, if necessary, but the amount of the lower-alkyltrialkoxysilane used is preferably 50 to 99 mole %, more preferably 70 to 99 mole %, the amount of the alkenyltrialkoxysilane used is preferably 1 to 50 mole %, more preferably 1 to 30 mole %, the amount of the aryltrialkoxysilane used is preferably 0 to 49 mole %, more preferably 0 to 29 mole %, and the amount of the trialkoxysilane used is preferably 0 to 49 mole %, more preferably 0 to 29 mole %.

The employment of an aryltrialkoxysilane sometimes further facilitates the synthesis of the desired organopolysilsesquioxane, and the employment of a trialkoxysilane results in an improvement in physical or chemical properties of the organopolysilsesquioxane.

As the organic solvent, the same organic solvents as mentioned as to the production process (A) may be used, though ketones, alcohols, esters or ethers are preferred because when they are used, the synthesis of the desired organopolysilsesquioxane is easy. These organic solvents may be used alone or in admixture with other organic solvents.

The amount of the organic solvent used is preferably 3 to 30 parts by volume per part by volume of the total sum of the lower-alkyltrialkoxysilane, the alkenyltrialkoxysilane, the aryltrialkoxysilane and the trialkoxysilane used (these four silanes are hereinafter referred to as the alkoxysilanes). As the organic amine, the same organic amines as mentioned as to the production process (A) may be used, though triethylamine and diethylamine are preferred. The amount of the organic amine used depends on the kind of the organic amine, the reaction conditions and the like and cannot uniquely be defined, though it is usually 0.05 to 3 moles per mole of the alkoxysilanes.

The amount of water added is usually about 3 to 30 moles per mole of the alkoxysilanes.

In the reaction of the alkoxysilanes, hydrolysis and condensation are effected at the same time by mixing the organic amine and water with the alkoxysilanes in the form of an organic solvent solution and heating the resulting mixed solution. The heating temperature is usually 130° C. or less, though it is preferable to heat at 60° to 120° C. for about 1 to 6 hours. When heated, the mixed solution may be stirred or merely left refluxed.

After completion of the heating, the same procedure as described as to the production process (A) is followed, whereby the desired organopolysilsesquioxane is obtained.

The organopolysilsesquioxane obtained by the above-mentioned production process (A) or production process (B) usually has a polystyrene reduced number average molecular weight of about 3,000 to 200,000 and is so good in stability that it does not become insoluble even if stored for a long time, for example, about 1 to 3 months.

Strong absorptions are observed in the vicinity of 1,120 cm$^{-1}$ and 1,040 cm$^{-1}$ in the infrared absorption spectrum of the organopolysilsesquioxane of this invention. It is known that an organopolysilsesquioxane represented by the above general formula (I) has two strong specific absorption bands due to the expansion and contraction of a Si—O—Si bond in the vicinity of 1,135 cm$^{-1}$ and 1,040 cm$^{-1}$ in its infrared absorption spectrum [J. Polym. Sci., Vol. C-1, p. 83 (1963), Japanese Patent Application Kokai (Laid-Open) No. 139,900/75, etc.]. Therefore, it is judged that the organopolysilsesquioxane of this invention also has a structure of the above general formula (I).

The heat resistance of the organopolysilsesquioxane of this invention varies depending upon the kinds or amounts of the lower alkyl group and the alkenyl group to be bonded as the side chains and the aryl group and hydrogen atom to be optionally bonded, and it is usually about 600° to 650° C. The larger the amount of the lower alkyl group, particularly methyl group, present, the higher the heat resistance. The organopolysilsesquioxane of this invention also has the feature that its solution has a relatively low viscosity.

The organopolysilsesquioxane of this invention can be crosslinked by irradiation with an ionizing radiation such as electron beam and it is possible to graft an organic polymer thereon. Therefore, it can be utilized for various purposes.

However, in order to make it possible to crosslink the organopolysilsesquioxane by irradiation with light or to enhance the rate of crosslinking by irradiation with an ionizing radiation, namely sensitivity to ionizing radiation, there may be added a compound which generates crosslinking-reaction-active species upon irradiation with light or an ionizing radiation.

The compound which generates crosslinking-reaction-active species upon irradiation with light or an ionizing radiation is not critical, and any organic solvent-soluble one may be used. As the crosslinking-reaction-active species, there may be used carbene radical, nitrene, and the like. As said compound, there may be used for example, azido compounds such as 4,4'- diazidostilbene, p-phenylenebisazide, 4,4'-diazidobenzophenone, 4,4'-diazidodiphenylmethane, 4,4'-diazidochalcone, 2,6-bis(4'-azidobenzal)-4-methylcyclohexanone, 4,4'-diazidodiphenyl, 4,4'-diazido-3,3'-dimethyldiphenyl, 2,7-diazidofluorene, p-benzoquinonediazide, p-naphthoquinonediazide and the like; carbonyl compounds such as diacetyl, benzoin, benzophenone, anthraquinone, 1,2-naphthoquinone, 1,4-naphthoquinone, β-methylanthraquinone, benzanthrone, violanthrone, 9-anthraldehyde, benzil, p,p'-dimethylaminobenzophenone, p,p'-tetramethyldiaminobenzophenone, chloranil and the like; aromatic hydrocarbons such as anthracene, chrysene and the like; nitro compounds such as nitrobenzene, p-dinitrobenzene, α-nitronaphthalene, p-nitrodiphenyl, 2-nitrofluorene, 5-nitroacenaphthene and the like; nitrogen compounds such as nitroaniline, 2-chloro-4-nitroaniline, 2,6-dichloro-4-nitroaniline, 5-nitro-2-aminotoluene, tetracyanoethylene and the like; sulfur compounds such as diphenyldisulfide, mercaptenedisulfide and the like; and azo compounds such as azobisisobutyronitrile, and the like.

Although the amount of the compound which generates crosslinking-reaction-active species is not critical, it is preferably 0.1 to 10 parts by weight, more preferably 0.1 to 5 parts by weight, per 100 parts by weight of the organopolysilsesquioxane. When it is less than 0.1 part by weight, the resulting silicone resin composition is sometimes insufficient in sensitivity to light or ionizing radiation, and when it exceeds 10 parts by weight, the resulting silicone resin composition tends to have low heat resistance.

It is also effective to add storage stabilizers, coloring agents and the like to the silicone resin composition.

Although the method of using the silicone resin composition of this invention is not critical, the following use method may be mentioned: In an organic solvent are dissolved the organopolysilsesquioxane, a compound which generates crosslinking-reaction-active species upon irradiation with light or an ionizing radiation, and, if necessary, additives, the resulting solution is applied onto a surface to be coated by a means, such as a spinner or the like, and the coated surface is then dried.

Suitable organic solvents include for example, ketones such as methyl ethyl ketone, methyl isobutyl ketone, diethyl ketone and the like; ethers such as di-n-butyl ether, ethylene glycol monoethyl ether, acetic ethylene glycol monomethyl ether and the like; hydrocarbons such as heptane, ethylbenzene, toluene and the like; halogenated hydrocarbons such as 1,2-dichloroethane, chlorobenzene, chloroform and the like; alcohols such as amyl alcohol, 2-ethylhexyl alcohol, hexanol and the like; esters such as n-butyl acetate, ethyl propionate, ethyl valerate and the like; and others.

The silicone resin composition applied onto the surface to be coated can be crosslinked upon irradiation with light or an ionizing radiation. That is to say, a coating film of a crosslinked organopolysilsesquioxane can be allowed to remain in the specific portions, namely a patterned film of a crosslinked organopolysilsesquioxane can be formed, by irradiating the specific portions of the silicone resin composition coating film on the surface to be coated with light or an ionizing radiation, and then dissolving and removing the unirradiated portions by use of a developer consisting of an organic solvent.

As the developer, there may be used the same organic solvents as those used for dissolving the above-mentioned silicone resin composition, but the employment of the same solvents is not indispensable.

Since the organopolysilsesquioxane of this invention can be crosslinked with an ionizing radiation as described above, a patterned film of a crosslinked organopolysilsesquioxane can also be formed by irradiating with an ionizing radiation the specific portions of an organopolysilsesquioxane coating film formed by using a solution of the organopolysilsesquioxane in an organic solvent in place of the solution of the aforesaid silicone resin composition in an organic solvent, and then dissolving and removing the unirradiated portions by use of a developer.

The film of the crosslinked organopolysilsesquioxane remaining on the coated surface has excellent electric insulating properties, as well as a high volume resistivity. The film further has a high dielectric breakdown value, a high arc-resistance, a low dielectric constant and a low dielectric loss tangent.

It is preferable to heat-treat the crosslinked organopolysilsesquioxane after development in order to improve the physical properties and the adhesion thereof to a surface to be coated. In particular, the frequency dependence of the dielectric constant of the crosslinked organopolysilsesquioxane as an electric insulating layer can be made smaller by heat-treatment at 250° to 450° C.

The crosslinked organopolysilsesquioxane is excellent in heat resistance and substantially no weight reduction is observed in nitrogen until the temperature reaches 550° to 600° C.

In addition, the crosslinked organopolysilsesquioxane is superior to a polyimide resin film in adhesion to a surface to be coated as is clear from the Examples hereinafter described.

As described above, the organopolysilsesquioxane of this invention is excellent as a heat-resistant surface-protecting material or electric insulating material and is particularly suitable as a surface-protecting material or insulating material for semiconductor device.

A process for producing a semiconductor device using the organopolysilsesquioxane of this invention is explained below referring to, for example, FIGS. 8 to 9. In the first step, as shown in FIG. 8 an organopolysilsesquioxane layer 2 is formed by applying, by means of a spinner or the like, for example, a solution of the organopolysilsesquioxane or the silicone resin composition in an organic solvent to the whole of the surface of a material for semiconductor device, for example, a substrate 1 having a circuit element on which a surface-protecting layer or an electric insulating layer is to be formed, and then the solution is dried. In the second step as shown in FIG. 9, portions 2B other than the portions 2A to be removed [for example, portions in which holes for providing electrodes (hereinafter referred to as the contact holes) are to be formed] of the aforesaid layer 2 is irradiated with light or an ionizing radiation by using a pattern mask 3 as shown in FIG. 9 or without using it, to crosslink the portions 2B and, as shown in FIG. 10, the portions 2A which are not crosslinked are then dissolved and removed with a developer whereby a patterned layer of the crosslinked organopolysilsesquioxane is formed. In the manner described above, a semiconductor device having a patterned layer obtained by crosslinking the organopolysilsesquioxane is produced. Said process for producing a semiconductor device enables easy production of a semiconductor device having the desired patterned surface-protecting layer or electric insulating layer without requiring troublesome steps and is particularly suitable as a process for producing a semiconductor device having an electric insulating layer between wiring layers in a multi-layer wiring structure and a surface-protecting layer for a circuit element, as compared with the conventional process for producing a semiconductor device, namely, a process which comprises forming a thin layer from a surface-protecting material or electric insulating material composed of an inorganic material such as silicone dioxide, silicon nitride, alumina, phosphorus glass or the like or an organic material such as polyamide resin or the like, thereafter forming a photoresist film, patterning the photoresist film by exposing it to light through a pattern mask and then developing it, subsequently removing the portions in which a contact hole is to be formed, by etching the insulating layer according to the pattern of the photoresist film, and thereafter removing the photoresist film.

The organopolysilsesquioxane of this invention can be used as an auxiliary film for the orientation of a liquid crystal, a heat-resistant paint, a modifier for organic polymer surface, and the like, as well as in a semiconductor device.

This invention is further explained below in more detail referring to Examples, which are not by way of limitation but by way of illustration.

Molecular weights in the Examples are standard polystyrene-reduced number average molecular weights which were obtained by means of a gel permeation chromatogram (GPC) (the standard polystyrene was manufactured by U.S.A. Pressure Chemical Co., Ltd.), and the measurement conditions are as follows:

Apparatus: high-temperature high-speed gel permeation chromatogram (Model 150-C ALC/GPC) manufactured by Waters Co., Ltd. in the U.S.A.

Column: SHODEX A-8M of 50 cm in length manufactured by Showa Denko Co., Ltd.

Measurement temperature: 40° C.
Flow rate: 1 cc/min
Solvent: tetrahydrofuran
Concentration: silicone resin (1 g)/tetrahydrofuran (100 ml)

EXAMPLE 1

Dioxane (175 ml, 2.05 moles) was placed in a reactor equipped with a reflux condenser, a dropping funnel and a stirrer, and triethylamine (14 ml, 0.1 mole) was added to the dioxane, followed by adding thereto $CH_3SiCl_3$ (15 ml, 0.125 mole), $C_6H_5SiCl_3$ (2 ml, 0.013 mole) and $CH_2=CHSiCl_3$ (8 ml, 0.063 mole).

Water (40 ml, 2.22 moles) was slowly dropped with stirring while the reactor was cooled with ice. The solution temperature at this time was 15° to 30° C. A white precipitate of triethylamine hydrochloride was gradually formed, but it was dissolved by further addition of water.

After completion of the addition of water, the reaction mixture was heated with stirring for 2 hours in an oil bath at 100° C. After completion of the reaction, the organic solvent layer was separated, washed with water until the washings became neutral, and then dried over anhydrous calcium sulfate. Thereafter, the drying agent was filtered off, and the filtrate was concentrated to dryness to obtain 13 g of an organopolysilsesquioxane. The molecular weight of the thus obtained organopolysilsesquioxane was 19,000, its thermal decomposition temperature in nitrogen was 590° C., and its infrared absorption spectrum was as shown in FIG. 1.

EXAMPLE 2

Figure 2:
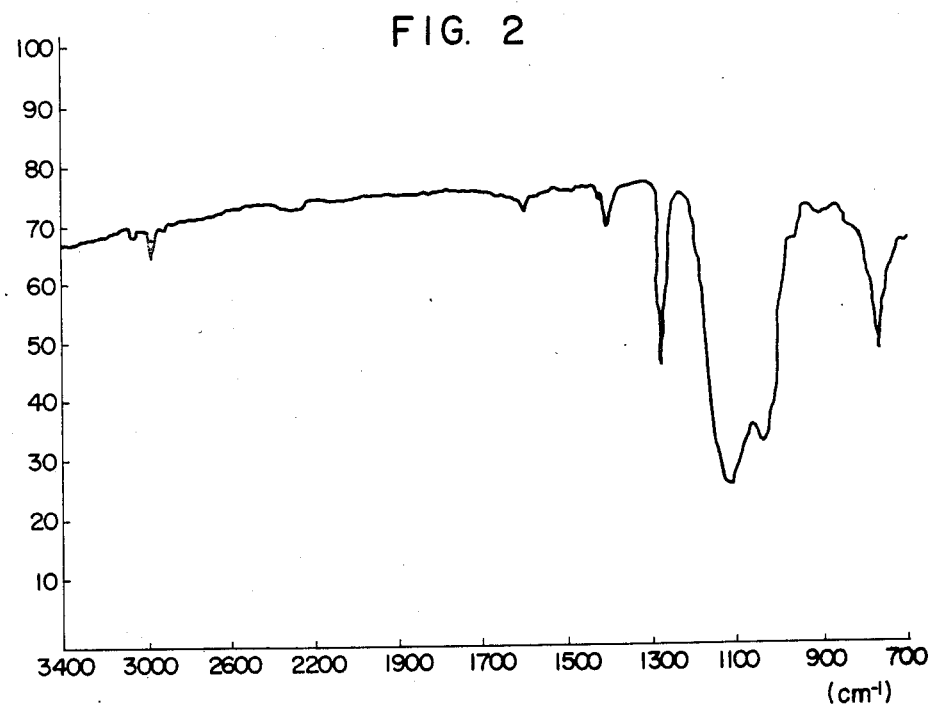

Triethylamine (14 ml, 0.1 mole), $CH_3SiCl_3$ (16 ml, 0.134 mole), $C_6H_5SiCl_3$ (4 ml, 0.025 mole) and $CH_2=CHSiCl_3$ (5 ml, 0.040 mole) were dissolved in methyl isobutyl ketone (175 ml, 1.4 moles), and water (40 ml, 2.22 moles) was added dropwise, after which the resulting mixture was subjected to hydrolysis in the same manner as in Example 1 and then heated at 100° C. for 4 hours. Subsequently, the same procedure as in Example 1 was repeated to obtain 14 g of an organopolysilsesquioxane. Its molecular weight was 10,000, its thermal decomposition temperature in nitrogen was 600° C., and its infrared absorption spectrum was as shown in FIG. 2.

EXAMPLE 3

Figure 3:
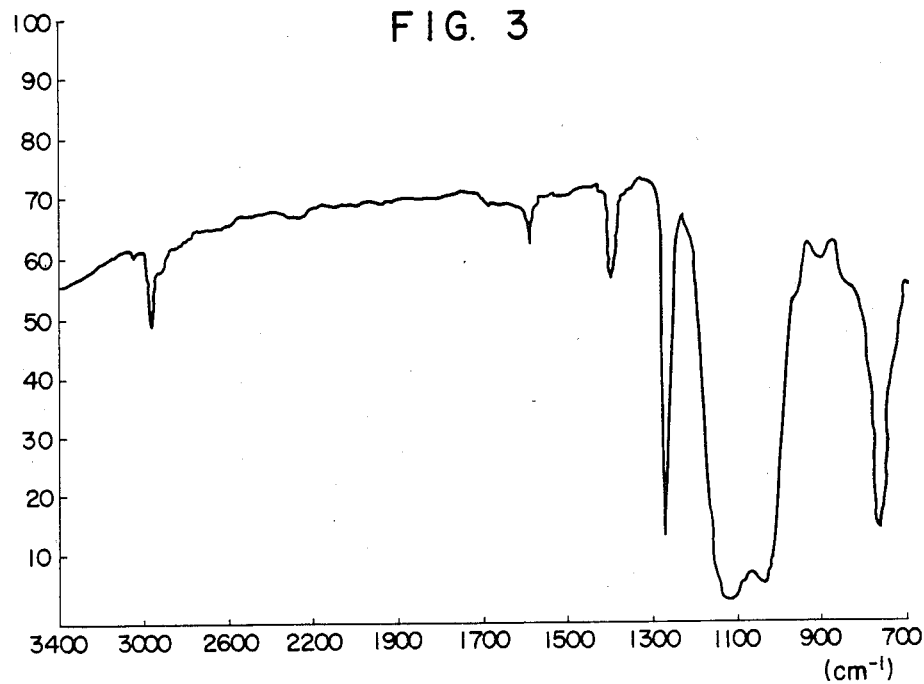

Triethylamine (14 ml, 0.1 mole) was dissolved in methyl isobutyl ketone (170 ml, 1.36 moles), followed by adding thereto $CH_3SiCl_3$ (18 ml, 0.151 mole), $C_6H_5SiCl_3$ (1.3 ml, 0.008 mole) and $CH_2=CHSiCl_3$ (5.2 ml, 0.041 mole). Water (40 ml, 2.22 moles) was added dropwise, and the resulting mixture was subjected to hydrolysis and then heated at 100° C. for 4 hours. Subsequently, in the same procedure as in Example 1 was repeated to obtain 14 g of an organopolysilsesquioxane. Its molecular weight was 50,000, its thermal decomposition temperature in nitrogen was 610° C., and its infrared absorption spectrum was as shown in FIG. 3.

EXAMPLE 4

Figure 4:
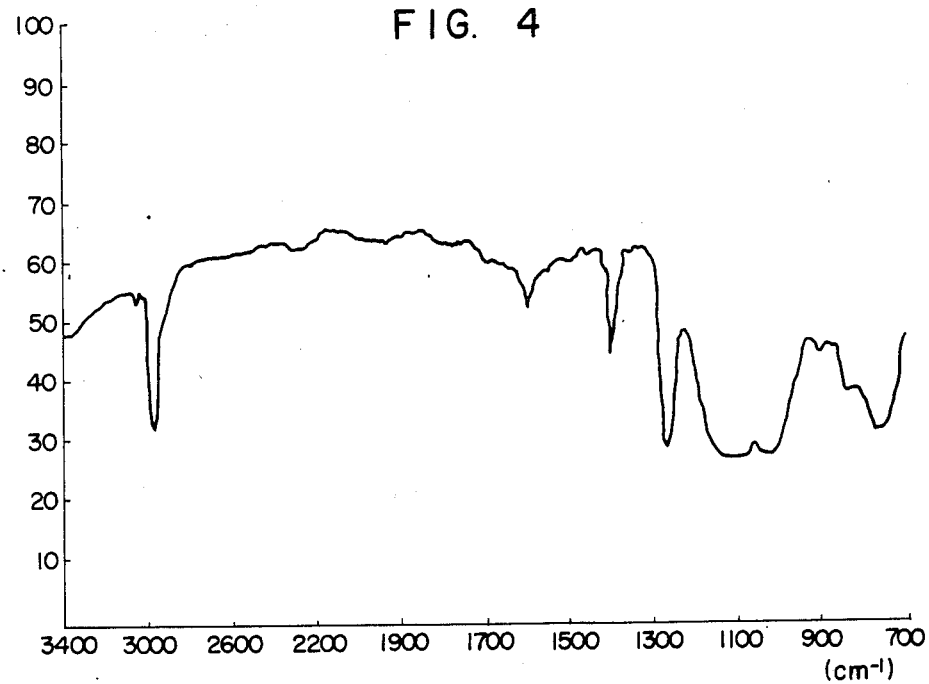

In methyl isobutyl ketone (183 ml, 1.46 moles) were dissolved $CH_3SiCl_3$ (24 ml, 0.201 moles), $CH_2=CHSiCl_3$ (2.2 ml, 0.017 mole) and triethylamine (15.7 ml, 0.113 mole), and water (41.7 ml, 2.32 moles) was added dropwise, after which the resulting mixture was subjected to hydrolysis in the same manner as in Example 1 and then heated at 100° C. for 4 hours. Subsequently, the same procedure as in Example 1 was repeated to obtain 13 g of an organopolysilsesquioxane. Its molecular weight was 40,000, its thermal decomposition temperature in nitrogen was 650° C., and its infrared absorption spectrum was as shown in FIG. 4.

EXAMPLE 5

Figure 5:
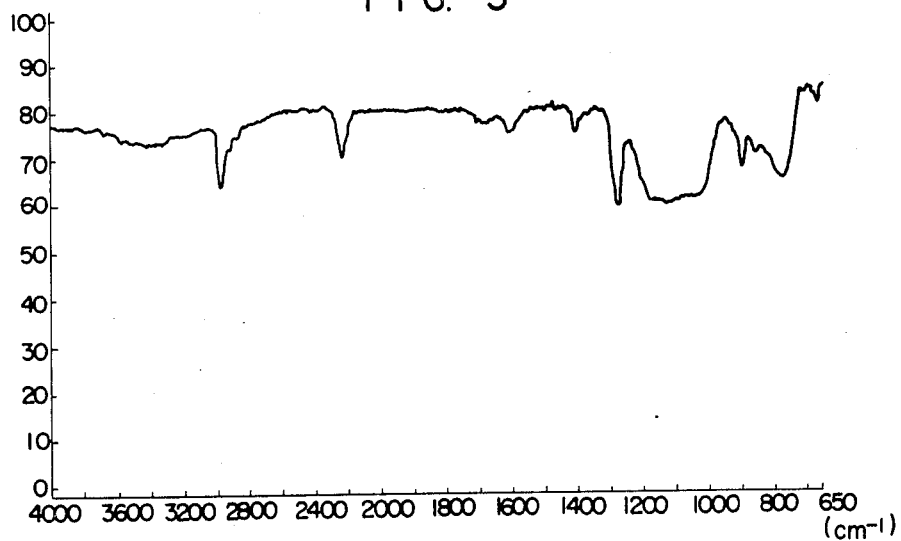

Triethylamine (28 ml, 0.2 mole), $CH_3SiCl_3$ (39.1 ml, 0.331 mole), $CH_2=CHSiCl_3$ (3.5 ml, 0.027 mole) and $HSiCl_3$ (3 ml, 0.03 mole) were dissolved in methyl isobutyl ketone (392 ml, 3.14 moles), and water (72 ml, 4 moles) was added dropwise, after which the resulting mixture was subjected to hydrolysis in the same manner as in Example 1 and then heated at 80° C. for 2 hours. Subsequently, the same procedure as in Example 1 was repeated to obtain 20.5 g of an organopolysilsesquioxane. Its molecular weight was 14,000, its thermal decomposition temperature in nitrogen was 625° C., and its infrared absorption spectrum was as shown in FIG. 5.

EXAMPLE 6

In a reactor equipped with a reflux condenser, a stirrer and a dropping funnel, triethylamine (11.5 ml, 0.088 mole), $CH_3Si(OCH_3)_3$ (40 ml, 0.279 mole), $CH_2=CHSi(OCH_3)_3$ (5.3 ml, 0.035 mole) and $C_6H_5Si(OCH_3)_3$ (6.5 ml, 0.035 mole) were dissolved in methyl isobutyl ketone (363 ml, 2.9 moles), and water (67.5 ml, 3.75 moles) was added dropwise to the resulting solution. During this procedure, the solution temperature was about 25° C. and substantially no heat generation was observed. After completion of the addition of water, the reaction mixture was heated with stirring at 80° C. for 4 hours. After completion of the reaction, the organic solvent layer was separated, washed with water until the washings became neutral, and then dried over anhydrous calcium sulfate. Thereafter, the drying agent was removed, and the residue was concentrated to dryness to obtain 17 g of an organopolysilsesquioxane. It had a molecular weight of 22,000 and a thermal decomposition temperature in nitrogen of 605° C. Its infrared absorption spectrum was as shown in FIG. 6.

EXAMPLE 7

Triethylamine (10.3 ml, 0.079 mole), $CH_3Si(OCH_3)_3$ (40 ml, 0.279 mole) and $CH_2=CHSi(OCH_3)_3$ (4.8 ml, 0.031 mole) were dissolved in methyl isobutyl ketone (356 ml, 2.84 moles), and water (60 ml, 3.33 moles) was added dropwise thereto. After completion of the addition of water, the resulting mixture was heated and stirred at 80° C. for 2 hours. The same post-treatment as in Example 6 was carried out to obtain 15 g of an organopolysilsesquioxane. It had a molecular weight of 24,000 and a thermal decomposition temperature in nitrogen of 640° C. Its infrared absorption spectrum was as shown in FIG. 7.

EXAMPLE 8

Each of the organopolysilsesquioxanes obtained in Examples 1 to 7 was dissolved in each of methyl isobutyl ketone, dioxane and toluene to find that all of them were soluble in all the solvents.

The organopolysilsesquioxanes obtained in Examples 1 to 7 were dissolved in 4-methyl-2-pentanol to prepare a 20% by weight solution, and stored at 8° C. for 2 months. Consequently, it was found that the viscosity change was 10% or less.

EXAMPLE 9

The nuclear magnetic resonance spectra of the organopolysilsesquioxanes obtained in Examples 1 to 7 were measured, and as a result, signals due to each of methyl group, hydrogen atom, vinyl group and phenyl group were observed at $\delta=0.05$ (singlet), $\delta=4.8-5.0$ (singlet), $\delta=6.07$ (singlet) and $\delta=7.20-8.00$ (multiplet), respectively. By integration of these absorptions, the proportions of organic groups as the side chains of each of the organopolysilsesquioxane of Examples 1 to 7 were obtained. The results are shown in Table 1.

TABLE 1

| Sample | Methyl group | Vinyl group | Phenyl group | Hydrogen atom |
|---|---|---|---|---|
| Example 1 | 63 | 29 | 8 | — |
| Example 2 | 68 | 20 | 12 | — |
| Example 3 | 76 | 20 | 4 | — |
| Example 4 | 93 | 7 | — | — |
| Example 5 | 85 | 7 | — | 8 |
| Example 6 | 80 | 10 | 10 | — |
| Example 7 | 90 | 10 | — | — |

EXAMPLE 10

In a reaction vessel equipped with a reflux condesner, a stirrer and a dropping funnel, triethylamine (14 ml, 0.1 mole), n-butyltrichlorosilane (27 ml, 0.161 mole), phenyltrichlorosilane (1.5 ml, 0.010 mole) and vinyltrichlorosilane (3.8 ml, 0.030 mole) were dissolved in methyl isobutyl ketone (175 ml, 1.4 mole) and water (40 ml, 2.22 mole) was added dropwise, after which the resulting mixture was subjected to hydrolysis in the same manner as in Example 1 and heated at 100° C. for 4 hours. Subsequently, the same procedure as in Example 1 was repeated to obtain 17 g of an organopolysilsesquioxane. Its molecular weight was 10,000 and its thermal decomposition temperature in nitrogen was 580° C. The infrared spectrum of the organopolysilsesquioxane was similar to those of the organopolysilsesquioxanes of Examples 1 to 7 and showed characteristic absorption bands of organopolysilsesquioxane in the vicinity of 1130 $cm^{-1}$ and 1040 $cm^{-1}$. And the nuclear magnetic resonance spectrum of the product showed the signals of n-butyl group, phenyl group and vinyl group. In the side chains of the organopolysilsesquioxane, butyl, phenyl and vinyl groups were present in a proportion of 79:5:16.

EXAMPLE 11

Triethylamine (14 ml, 0.1 mole), methyltrichlorosilane (19 ml, 0.161 mole), allyltrichlorosilane (4.3 ml, 0.030 mole) and phenyltrichlorosilane (1.5 ml, 0.010 mole) were dissolved in methyl isobutyl ketone in the same reaction vessel as in Example 10, and water (40 ml, 2.22 mole) was added dropwise, after which the resulting mixture was subjected to hydrolysis in the same manner as in Example 1, and then heated at 110° C. for 2 hours. Subsequently, the same procedure as in Example 1 was repeated to obtain 14 g of an organopolysilsesquioxane. Its molecular weight was 13,000 and its thermal decomposition temperature in nitrogen was 590° C. The infrared spectrum of the organopolysilsesquioxane was similar to those of the organopolysilsesquioxanes of Examples 1 to 7 and showed characteristic absorption bands of organopolysilsesquioxane in the vicinity of 1,135 $cm^{-1}$ and 1,040 $cm^{-1}$. The nuclear magnetic resonance spectrum of the product was measured, and as a result, signals due to each of methyl group, allyl group and phenyl group were observed. In the side chains of the organopolysilsesquioxane, methyl phenyl and allyl groups were present in a proportion of 80:5:15.

EXAMPLE 12

Triethylamine (14 ml, 0.1 mole), methyltrichlorosilane (19 ml, 0.161 mole), p-tolyltrichlorosilane (1.5 ml, 0.010 mole) and vinyltrichlorosilane (3.8 ml, 0.030 mole) were dissolved in methyl isobutyl ketone (175 ml, 1.4 mole) in the same vessel as in Example 10, and water was added dropwise, after which the resulting mixture was subjected to hydrolysis in the same manner as in Example 1 and then heated at 100° C. for 2 hours. Subsequently, the same manner as in Example 1 was repeated to obtain 14 g of an organopolysilsesquioxane. Its molecular weight was 15,000 and its thermal decomposition temperature in nitrogen was 590° C. The infrared spectrum of the organopolysilsesquioxane was similar to those of the organopolysilsesquioxanes of Examples 1 to 7 and showed characteristic absorption bands of organopolysilsesquioxane in the vicinity of 1,130 $cm^{-1}$ and 1,040 $cm^{-1}$. And the nuclear magnetic resonance spectrum of the organopolysilsesquioxane showed the signals of methyl group, p-tolyl group and vinyl group. In the side chains of the organopolysilsesquioxane, methyl, p-tolyl and vinyl groups were present in a proportion of 81:5:14.

EXAMPLE 13

The organopolysilsesquioxane (5 g) obtained in Example 3 was dissolved in n-butyl acetate to prepare a 20% by weight solution, and 2,6-bis(4'-azidobenzal)-4-methylcyclohexanone (0.15 g) was further added thereto to prepare a solution of a silicone resin composition. This solution was applied to a silicone wafer of 2 inches in thickness by a spin coating method at 4,000 r.p.m. and then heated at 80° C. for 15 minutes to remove the solvent, whereby a thin film (thickness: about 1 μm) of the silicone resin composition was formed. The thin film was exposed to light through a pattern mask for 6 seconds by means of an exposing machine (manufactured by Mikasa Co., Ltd.; an ultra-high pressure mercury lamp, output 43 W/m$^2$), and then developed by immersion of the silicone wafer in ethylene glycol monoethyl ether for 1 minute to obtain a clear pattern of 5 μm.

A coating film of the silicone resin composition was separately prepared from the solution of the silicone resin composition by a cast method, and the whole surface of the coating film was exposed to light as above by means of the aforesaid exposure machine. Subsequently, the coating film was heated in a nitrogen stream at 250° C. for 2 hours, at 350° C. for 1 hour, and then at 450° C. for 30 minutes, and subjected to thermogravimetric analysis, in which no weight loss was observed up to 600° C. and the percentage of residual weight after further heating the coating film to 800° C. to calcine the same was 95%.

EXAMPLE 14

In the same manner as in Example 1, 13 g of a polysilsesquioxane was prepared from 15.7 ml (0.113 mole) of triethylamine, 24 ml (0.201 mole) of $CH_3SiCl_3$, 2.2 ml (0.017 mole) of $CH_2=CHSiCl_3$, 183 ml (1.46 mole) of methyl isobutyl ketone and 41.7 ml (2.32 moles) of water. Its molecular weight was 40,000. The proportions of organic groups as its side chains were measured in the same manner as in Example 9 to find that the proportion of methyl groups was 93 and that of vinyl groups was 7.

Subsequently, the obtained polysilsesquioxane (5 g) was subjected to preparation of a solution, application by a spin coating method, exposure and development in the same manner as in Example 13 to obtain a clear pattern of 5.0 μm. A coating film of a silicone resin composition was obtained in the same manner as in Example 13, and subjected to thermogravimetric analysis as in Example 13 to find that no weight loss was observed up to 600° C. and that the percentage of residual weight was 96%.

EXAMPLE 15

Figure 12:
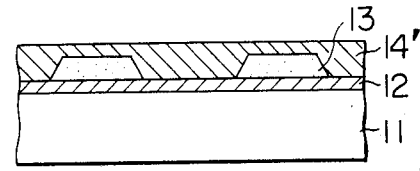
Figure 13:
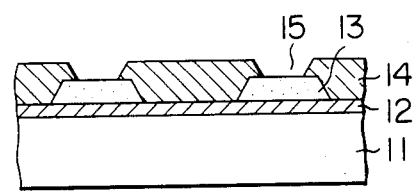
Figure 11:
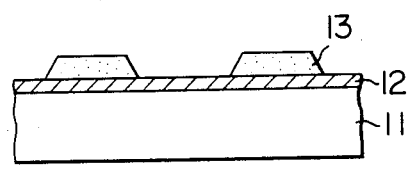

As shown in FIG. 11, there was prepared a semiconductor substrate 11 which had a circuit element and was coated with a protective film 12 consisting of $SiO_2$ and the like so that the predetermined portions of its surface were exposed. An aluminum wiring layer 13 of about 1 μm in thickness having a predetermined pattern was formed on the circuit element side. Subsequently, as shown in FIG. 12, the silicone resin composition solution prepared in Example 14 was applied to the whole exposed surface by means of a spinner at a revolution rate of 4,000 r.p.m. and then heated at a temperature of 80° C. for 15 minutes to remove the solvent, whereby a thin film 14' of about 1 μm in thickness of the silicone resin composition was formed. The thin film 14' was exposed to light through a pattern mask for 6 seconds by means of an exposing machine (manufactured by Mikasa Co., Ltd.) equipped with an ultra-high pressure mercury lamp having an output of 43 W/m$^2$. Thereafter, the uncrosslinked portions were dissolved and removed by immersing the semiconductor substrate in ethylene glycol monoethyl ether for 1 minute, whereby a patterned insulating layer 14 having contact holes 15 was formed as shown in FIG. 13. Subsequently, the insulating layer 14 was heat-treated in a nitrogen stream at a temperature of 250° C. for 2 hours and then at a temperature of 350° C. for 1 hour.

Figure 14:
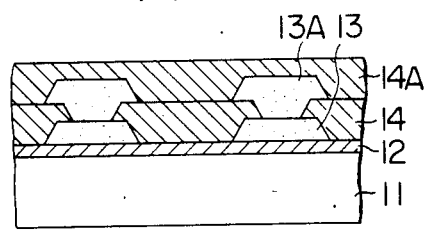
Figure 15:
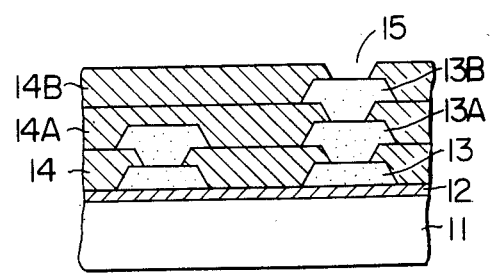

By repeating the same steps as above from the formation of the aluminum wiring layer, the second wiring layer 13A and the second insulating layer 14A were formed as shown in FIG. 14, and the third wiring layer 13B and the third insulating layer 14B were further formed as shown in FIG. 15, whereby a semiconductor device was produced.

EXAMPLE 16

Using the silicone resin composition solution prepared in Example 14, the same procedure as in Example 15 was repeated to produce a semiconductor device having patterned insulating layers 14, 14A and 14B having contact holes 15 as shown in FIG. 15.

EXAMPLE 17

The objective of this example is to examine a crosslinked organopolysilsesquioxane layer for adhesion.

A silicone wafer on which a $SiO_2$ coating film had been formed and an aluminum plate were used as substrates, and the same silicone resin composition solution as used in each of Examples 13 and 14 was applied to each substrate by means of a spinner to form a thin film. The thin film was heated at 100° C. for 1 hour to remove the solvent, after which the whole surface of the thin film was exposed to light for 6 seconds by means of the same exposing machine as in Example 13, and the thin film was heated at 250° C. for 2 hours, at 350° C. for 1 hour and then at 450° C. for 30 minutes, all in a nitrogen stream. Each of the thus obtained silicone wafer and aluminum plate coated with the thin film was immersed in water in an autoclave and heated for 2 hours in an oil bath maintained at a a temperature of 110° C. Thereafter, notches were made lengthwise and widthwise at intervals of 1 mm on the aforesaid thin film by means of a razor to form 100 squares of 1 mm×1 mm. When an adhesive cellophane tape was attached to the squares and then peeled off, the squares were not peeled from the silicone wafer and the aluminum plate. On the other hand, a polyimide resin (PIQ manufactured by Hitachi Chemical Co., Ltd.) dissolved in N-methyl-2-pyrrolidone was applied by means of a spinner to a silicone wafer on which a $SiO_2$ coating film had been formed, and heated at a temperature of 100° C. for 1 hour to remove the solvent, and the thin film was subsequently heated at a temperature of 200° C. for 1 hour and then at 350° C. for 1 hour both in a stream of nitrogen, and treated in water under the same conditions as described above, after which the same peeling-off test as above was carried out to find that all the squares were peeled off.

What is claimed is:

1. A composition comprising a solvent-soluble organopolysilsesquioxane represented by the formula (I):

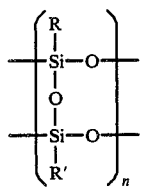
(I)

wherein R and R', which may be the same or different, represent hydrogen, lower alkyl, alkenyl, or aryl groups, wherein at least lower alkyl and alkenyl groups are present in the organopolysilsesquioxane, and n is degree of polymerization, and a compound which generates crosslinking-reaction-active species upon irradiation with light or an ionizing radiation.

2. A composition according to claim 1, wherein the lower alkyl groups have 1 to 5 carbon atoms; the alkenyl groups have 2 to 5 carbon atoms; and the aryl groups have 6 to 10 carbon atoms.

3. A composition according to claim 2, wherein the lower alkyl groups are selected from the group consisting of methyl, ethyl, propyl and butyl, and the alkenyl groups are selected from the group consisting of vinyl, propenyl, butenyl, pentenyl and allyl and the aryl groups are selected from the group consisting of phenyl, dimethylphenyl, ethylphenyl, trimethylphenyl, methyl-ethylphenyl, propylphenyl, tetramethylphenyl, methylpropylphenyl, diethylphenyl, butylphenyl and tolyl.

4. A composition according to claim 3, wherein the lower alkyl groups are methyl and the alkenyl groups are vinyl.

5. A composition according to claim 4, wherein the aryl groups are phenyl.

6. A composition according the claim 1, wherein the proportions of the lower alkyl group, alkenyl group, aryl group and hydrogen atom bonded as the side chains are 50–99, 1–50, 0–49 and 0–49, respectively, per 100 of the total side chains.

7. A composition according to claim 1, wherein n has a value corresponding to a polystyrene-reduced number average molecular weight of 3,000 to 200,000.

8. A composition according to claim 1, wherein the compound which generates crosslinking-reaction-active species upon irradiation with light or an ionizing radiation is an azido compound, a carbonyl compound, an aromatic hydrocarbon, tetracyanoethylene, a nitro compound selected from the group consisting of nitrobenzene, p-dinitrobenzene, α-nitronaphthalene, p-nitrodiphenyl, 2-nitrofluorene, 5-nitroacenaphthene, nitroaniline, 2-chloro-4-nitroaniline, 2,6-dichloro-4-nitroaniline and 5-nitro-2-aminotoluene, a sulfur compound or an azo compound.

9. A composition according to claim 1, wherein the compound which generates cross-linking-reaction-active species upon irradiation with light or an ionizing radiation added is 0.1 to 10 parts by weight per 100 parts by weight of the organopolysilsesquioxane.

10. A composition according to claim 9, wherein said compound is an azido compound, a carbonyl compound, an aromatic hydrocarbon, a nitro compound, a nitrogen compound, a sulfur compound or an azo compound.

11. A composition according to claim 8, wherein said azido compound is selected from the group consisting of 4,4'-diazidostilbene, p-phenylenebisazide, 4,4'-diazidobenzophenone, 4,4'-diazidodiphenylmethane, 4,4'-diazidochalocone, 2,6-bis(4'-azidobenzal)-4-methylcyclohexanone, 4,4'-diazidodiphenyl, 4,4'-diazido-3,3'-dimethyldiphenyl, 2,7-diazidofluorene, p-benzoquinonediazide, and p-naphthoquinonediazide.

12. A composition according to claim 8, wherein said carbonyl compound is selected from the group consisting of diacetyl, benzoin, benzophenone, anthraquinone, 1,2-naphthoquinone, 1,4-naphthoquinone, β-methylanthraquinone, benzathrone, violanthrone, 9-anthraldehyde, benzil, p,p'-dimethylaminobenzophenone, p,p'tetramethyldiaminobenzophenone, and chloranil.

13. A compositiom according to claim 8, wherein said aromatic hydrocarbon is anthracene or chrysene.

14. A composition according to claim 8, wherein said sulfur compound is diphenyldisulfide or mercaptenedisulfide.

15. A composition according to claim 8, wherein said azo compound is azobisisobutyronitrile.

* * * * *